(12) United States Patent
Kasko et al.

(10) Patent No.: US 6,613,640 B2
(45) Date of Patent: Sep. 2, 2003

(54) METHOD FOR FABRICATING AN INTEGRATED FERROELECTRIC SEMICONDUCTOR MEMORY AND INTEGRATED FERROELECTRIC SEMICONDUCTOR MEMORY

(75) Inventors: Ihar Kasko, Fishkill, NY (US); Volker Weinrich, Paris (FR); Matthias Krönke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/097,509

(22) Filed: Mar. 14, 2002

(65) Prior Publication Data

US 2002/0137301 A1 Sep. 26, 2002

(30) Foreign Application Priority Data

Mar. 14, 2001 (DE) .................................. 101 12 276.4

(51) Int. Cl.[7] .............................................. H01L 21/20
(52) U.S. Cl. ...................... 438/393; 438/381; 438/396; 438/397; 438/398; 438/399; 438/253; 438/254; 438/255; 438/256
(58) Field of Search ................................. 438/240, 253, 438/254, 255, 256, 381, 393, 396, 397, 398, 399

(56) References Cited

U.S. PATENT DOCUMENTS

| | | | | |
|---|---|---|---|---|
| 5,825,609 A | * | 10/1998 | Andricacos et al. | ..... 361/321.4 |
| 5,998,250 A | * | 12/1999 | Andricacos et al. | ........ 438/240 |
| 6,146,941 A | | 11/2000 | Huang et al. | ............... 438/253 |
| 6,320,213 B1 | * | 11/2001 | Kirlin et al. | ................ 257/295 |

* cited by examiner

Primary Examiner—Hoai Ho
Assistant Examiner—Reneé R. Berry
(74) Attorney, Agent, or Firm—Laurence A. Greenberg; Werner H. Stemer; Gregory L. Mayback

(57) ABSTRACT

The integrated ferroelectric semiconductor memory is fabricated according to the stack cell principle. A ferroelectric capacitor module is formed on an intermediate oxide above a selection transistor located in or on a semiconductor wafer. The capacitor module is brought into conductive contact by its bottom capacitor electrode with an electrode of the selection transistor by means of an electrically conductive plug leading through the intermediate oxide. A layer system of a conductive oxygen diffusion barrier and a conductive adhesion layer is deposited directly below the bottom capacitor electrode, and the adhesion layer and the overlying oxygen diffusion barrier are deposited directly into the contact hole and form the plug at least in the region lying directly below the bottom capacitor electrode.

5 Claims, 2 Drawing Sheets

SELECTION TRANSISTOR

SELECTION TRANSISTOR

METHOD FOR FABRICATING AN INTEGRATED FERROELECTRIC SEMICONDUCTOR MEMORY AND INTEGRATED FERROELECTRIC SEMICONDUCTOR MEMORY

BACKGROUND OF THE INVENTION

Field of the Invention

The invention lies in the semiconductor technology field. More specifically, the invention relates to an integrated ferroelectric semiconductor memory having a ferroelectric capacitor module formed according to the stack cell principle on an intermediate oxide layer above a selection transistor located in or on a semiconductor wafer. The capacitor module is conductively connected by its bottom electrode to an electrode of the selection transistor by means of an electrically conductive plug formed in a contact hole leading through the intermediate oxide. A conductive oxygen diffusion barrier is provided directly below the bottom capacitor electrode in order to protect the plug from oxygen diffusion and a conductive adhesion layer is provided below the oxygen diffusion barrier, of which the adhesion layer and the overlying oxygen diffusion barrier fill the contact hole at least in its upper region and form the plug there.

The invention further pertains to a method for fabricating an integrated ferroelectric semiconductor memory according to the stack cell principle, in which a ferroelectric capacitor module is formed on an intermediate oxide above a selection transistor located in or on a semiconductor wafer which capacitor module is brought into conductive contact by its bottom capacitor electrode with an electrode of the selection transistor by means of an electrically conductive plug leading through the intermediate oxide. The method, generically, comprises the following steps: a layer system comprising a conductive oxygen diffusion barrier and a conductive adhesion layer is deposited directly below the bottom capacitor electrode, and the adhesion layer and the overlying oxygen diffusion barrier are deposited directly into the contact hole and form the conductive plug at least in the region lying directly below the bottom capacitor electrode.

Such a ferroelectric semiconductor memory and such a fabrication method are disclosed in German patent DE 198 42 684 C1 (cf. copending, commonly assigned patent application Ser. No. 09/941,910).

In ferroelectric semiconductor memories fabricated according to the stack cell principle, the transistors are typically fabricated on the wafer and then an intermediate oxide layer is deposited over them. The ferroelectric capacitors are fabricated on this intermediate oxide above the selection transistors. The connection between transistors and capacitors is achieved by means of a plug which fills a contact hole which penetrates through the intermediate oxide layer, which plug is situated directly below the capacitor in the case of the stack cell principle.

In order to condition the ferroelectric layer, it is necessary to carry out a heat treatment in an oxygen atmosphere at temperatures of up to 800° C. (ferro-anneal). During this heat treatment, the plug, which usually comprises polysilicon or tungsten, must be protected from oxidation, since such oxidation can irreversibly interrupt the electrical connection between the capacitor module and the selection transistor. Moreover, reactions between the capacitor electrodes, the ferroelectric and the plug are to be avoided if they impair the functionality of the chip.

All products with ferroelectric layers that are commercially available at the present time are constructed according to the offset cell principle and have an integration density of only a few kilobits through to one megabit. In this case, the contact between the plug and the electrode is avoided during the ferro-anneal. However, the result is a significantly larger standard cell.

In order to prevent the oxidation of the plug in ferroelectric semiconductor memories constructed according to the stack cell principle, layer systems have been introduced which act inter alia as an oxygen diffusion barrier. However, even with the use of an oxygen diffusion barrier (also cf. FIG. 1), it is very difficult to produce a permanently conductive contact between a bottom electrode and the selection transistor, because an adhesion layer lying below the diffusion barrier can be oxidized from the side during the oxygen heat treatment of the ferroelectric.

In the above-mentioned German patent DE 198 42 684 C1 the electrically conductive plug which connects the bottom capacitor electrode to an electrode of a selection transistor is formed from an electrically conductive material deposited into the contact hole, e.g. from doped polysilicon, tungsten, tantalum, titanium, titanium nitride or tungsten silicide, and an overlying oxygen diffusion barrier.

U.S. Pat. No. 6,146,941 (German published patent application DE 198 38 741 A1) describes a capacitor and a process wherein in a contact window that is open toward a source/drain region of a selection window, firstly an adhesion/barrier layer made of Ti/TiNx, which covers the bottom and the sidewall of the contact window and the top side of an insulating layer, and a metallic bottom capacitor electrode above the adhesion/barrier layer are deposited directly into the contact window.

German published patent application DE 199 26 501 A1 (cf. copending, commonly assigned patent application Ser. No. 10/013,234) discloses a method for fabricating a ferroelectric or DRAM semiconductor memory device in which Ir/IrOx is used as oxygen diffusion barrier in combination with adhesion layers.

SUMMARY OF THE INVENTION

It is accordingly an object of the invention to provide a fabrication method for an integrated ferroelectric semiconductor memory according to the stack cell principle and such an integrated ferroelectric semiconductor memory according to the stack cell principle, which overcome the above-mentioned disadvantages of the heretofore-known devices and methods of this general type and which is improved such that the oxidation of the polysilicon or tungsten material of the plug and of the adhesion layer during the oxygen heat treatment of the ferroelectric can be reliably prevented.

With the foregoing and other objects in view there is provided, in accordance with the invention, an integrated ferroelectric semiconductor memory, comprising:

an intermediate oxide layer above a selection transistor located in or on a semiconductor wafer and a ferroelectric capacitor module formed according to a stack cell principle on the intermediate oxide layer and having a bottom electrode;

an electrically conductive plug formed in a contact hole leading through the intermediate oxide layer and connecting the bottom electrode of the capacitor module to an electrode of the selection transistor;

a conductive oxygen diffusion barrier of Ir and IrOx directly below the bottom electrode for protecting the plug from oxygen diffusion and a conductive adhesion layer below the oxygen diffusion barrier, the adhesion layer and the oxygen diffusion barrier filling the contact hole at least in an upper region thereof and forming the plug in the upper region;

the oxygen diffusion barrier including an Ir layer in the contact hole and an IrOx layer covering the contact hole above the Ir layer.

In accordance with an added feature of the invention, the plug consists of, i.e., is formed exclusively of, the adhesion layer and the oxygen diffusion barrier.

In accordance with an additional feature of the invention, the plug comprises a first segment disposed directly above the selection transistor electrode and formed of a material selected from the group consisting of polysilicon and tungsten, and a second segment above the first segment formed of the adhesion layer and the oxygen diffusion layer.

In accordance with another feature of the invention, the contact hole has a beveled sidewall tapering downward toward the selection transistor.

In accordance with a further feature of the invention, the adhesion layer comprises Ti.

With the above and other objects in view there is also provided, in accordance with the invention, a method of fabricating an integrated ferroelectric semiconductor memory according to the stack cell principle, wherein a ferroelectric capacitor module is formed on an intermediate oxide above a selection transistor in or on a semiconductor wafer, and a bottom electrode of the capacitor module is conductively connected with an electrode of the selection transistor via an electrically conductive plug leading through the intermediate oxide. The method comprises the following steps:

depositing a layer system with a conductive oxygen diffusion barrier and a conductive adhesion layer directly below the bottom electrode of the capacitor;
wherein the adhesion layer and the overlying oxygen diffusion barrier are deposited directly into the contact hole to form the conductive plug at least in a region directly below the bottom electrode of the capacitor;
and thereby forming the oxygen diffusion barrier with an Ir layer in the contact hole and an IrOx layer covering the contact hole above the Ir layer of the oxygen diffusion barrier.

In accordance with again an added feature of the invention, the plug is exclusively formed from the adhesion layer deposited into the contact hole and from the oxygen diffusion barrier.

In accordance with again an additional feature of the invention, prior to depositing the adhesion layer and the oxygen diffusion barrier, a lower section of the contact hole is partly filled with a section made of polysilicon or tungsten.

In accordance with a concomitant feature of the invention, a sidewall of the contact hole is formed with a bevel such that the contact hole tapers downward toward the selection transistor.

In accordance with one primary aspect of the fabrication method according to the invention, the polysilicon or tungsten filling of the contact hole is completely or partly omitted and, instead of this, the adhesion layer and the oxygen diffusion barrier comprising Ir and IrOx are deposited directly into the contact hole formed for the plug, in such a way as to form an IrOx layer, which covers the contact hole above the Ir layer lying in the contact hole. Since the layers concerned are usually sputtered, it is advantageous to taper the contact hole during etching, that is to say to bevel its side wall in such a way that it tapers downward, that is to say toward the selection transistor. By way of example, the adhesion layer may comprise Ti and the oxygen diffusion barrier may comprise Ir/IrOx, the Ir lying in the contact hole and IrOx lying above the Ir.

The fabrication method according to the invention and a ferroelectric semiconductor memory realized with the features according to the invention have, in particular, the following advantages:

if, despite the IrOx layer, oxygen diffusion occurs as far as the adhesion layer, there is a considerable overlap between barrier and electrical contact, in other words the oxygen during the heat treatment required for conditioning the ferroelectric of the ferroelectric capacitor, must firstly oxidize that section of the adhesion layer which covers the side wall of the contact hole, the side wall running diagonally downward, if appropriate, before it oxidizes the adhesion layer at the contact area with respect to the plug and interrupts the electrical connection;

adhesion layer and iridium need not be patterned with the aid of a lithography plane, but rather can be pattered by means of CMP, for example. This saves a lithographic patterning plane.

if the plug additionally has a polysilicon section between the filled-in adhesion layer and the selection transistor electrode, this polysilicon filling can, if appropriate, be deposited at the same time times as the gate polysilicon.

It will be understood that the above materials such as iridium, iridium oxide for the oxygen diffusion barrier, titanium for the adhesion layer and silicon oxide for the intermediate oxide layer are only examples. The invention is not restricted to these materials.

Other features which are considered as characteristic for the invention are set forth in the appended claims.

Although the invention is illustrated and described herein as embodied in a method for fabricating an integrated ferroelectric semiconductor memory and integrated ferroelectric semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
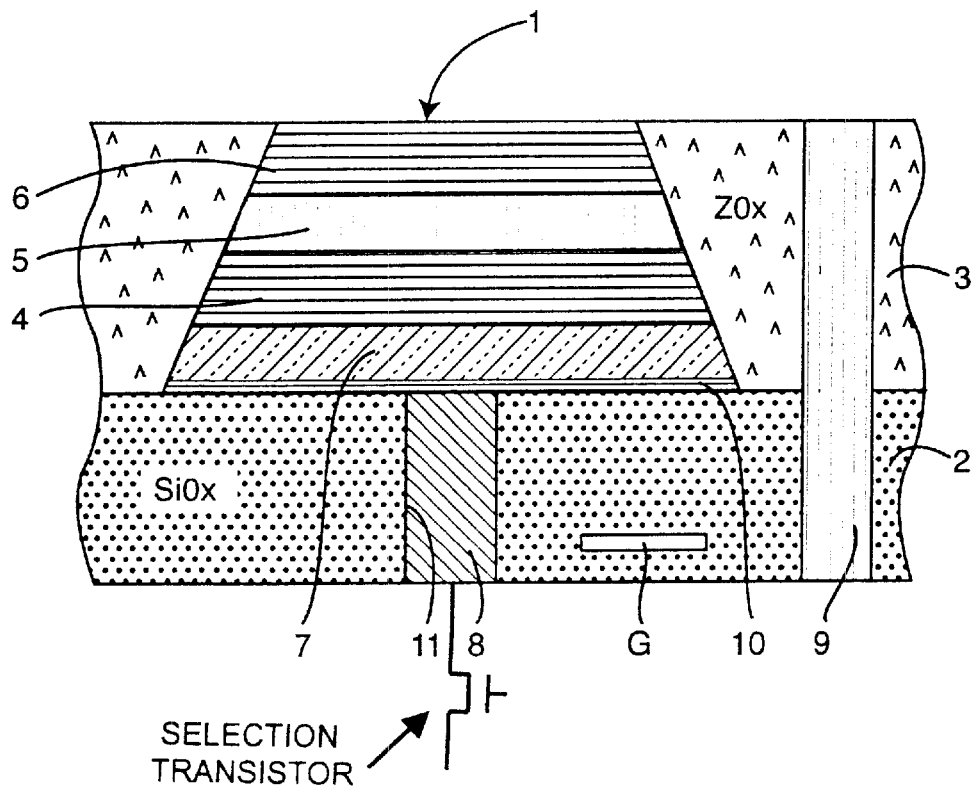
FIG. 1 is a schematic section through a segment of a ferroelectric semiconductor memory with a first basic layer construction of a ferroelectric capacitor realized according to the stack cell principle.

Referring now to the figures of the drawing in detail and first, particularly, to the sectional view of FIG. 1 thereof, there is shown a ferroelectric semiconductor memory constructed according to the stack cell principle. A capacitor module 1, which comprises a bottom electrode 4, a ferroelectric 5, and a top electrode 6, lies on an intermediate oxide layer 2, for example made of silicon oxide. The capacitor module 1 is embedded in a second intermediate oxide layer 3, and the top electrode 6 is uncovered, i.e., exposed, at the top and can be electrically connected in the further fabrication process in accordance with the requirements of the respective chip design. A plug 8, which is introduced into a contact hole 11 leading vertically through the first intermediate oxide layer 2 and comprises polysilicon or tungsten, for example, serves for the connection of the bottom electrode 4 of the capacitor module 1.

As mentioned, the ferroelectric 5 must be conditioned or crystallized by means of a so-called ferro-anneal in an oxygen atmosphere. In order to protect the plug 8 from oxygen diffusion which would oxidize the plug material, an oxygen diffusion barrier 7 is deposited above the plug 8 directly below the bottom electrode 4 of the capacitor module 1. The oxygen diffusion barrier 7 comprises an Ir/IrOx layer system. Furthermore, an adhesion layer 10, for example made of titanium, lies below said oxygen diffusion barrier 7. Also shown is a second contact hole or a second plug 9 which passes vertically through both intermediate oxide layers 2 and 3. Furthermore, a transistor gate G, which is the gate electrode belonging to the non-illustrated selection transistor, is deposited in the first (lower) intermediate oxide layer 2.

Figure 2:
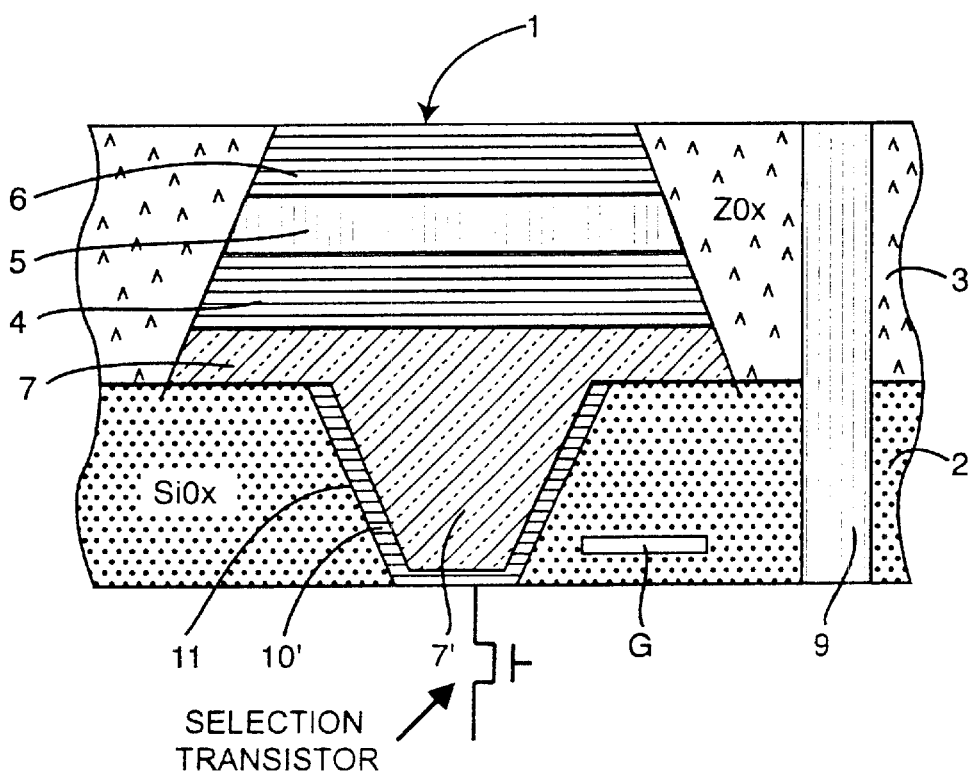
FIG. 2 is a schematic section through a segment of a ferroelectric semiconductor memory, illustrating a first exemplary embodiment of the method according to the invention.

The first exemplary embodiment of the invention as shown in FIG. 2 shows that the polysilicon or tungsten filing in the contact hole 11 is completely omitted. Instead of this, in the contact hole 11, firstly the adhesion layer 10' is deposited and over that is deposited the oxygen diffusion barrier 7' made of Ir, an IrOx layer 7 which covers the contact hole 11 being formed above the layer 7'.

In order to facilitate a deposition of an adhesion layer 10' and of the oxygen diffusion barrier 7' into the contact hole 11 through sputtering and to obtain an adhesion layer 10' that is as uniform as possible in the contact hole 11, the side wall of the contact hole 11 is beveled in such a way that it tapers downward toward the selection transistor. See FIG. 2. Such beveling or such tapering can be achieved by a conventional etching method.

Figure 3:
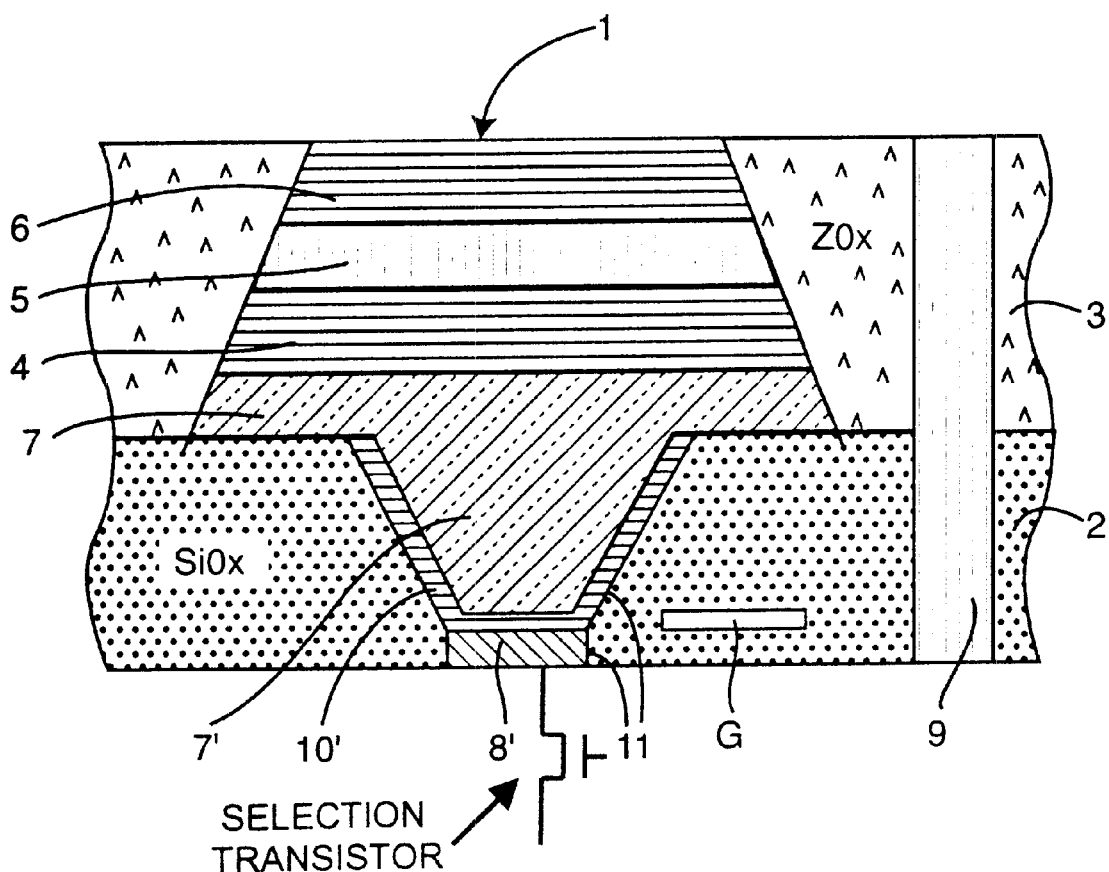
FIG. 3 is a further schematic section through a segment of a ferroelectric semiconductor memory, illustrating a second exemplary embodiment of the method according to the invention.

In the second exemplary embodiment shown in FIG. 3, the contact hole 11 is filled with a polysilicon plug section 8' in its lower section facing the selection transistor. The adhesion layer 10' is then deposited over that in such a way that it uniformly covers the polysilicon plug section 8' and the beveled side wall of the contact hole 11. The oxygen diffusion barrier 7' is then deposited over the adhesion layer 10' in exactly the same way as in the exemplary embodiment shown in FIG. 2. As a result, a layer 7 of IrOx is then located above the Ir layer 7'.

If, in the exemplary embodiments shown in FIGS. 2 and 3, despite the IrOx layer, oxygen diffusion occurs as far as the adhesion layer 10', there is a considerable overlap, in other words, during the heat treatment in oxygen, namely the ferro-anneal, the adhesion layer 10' running obliquely downward must first be oxidized before the adhesion layer at the contact area either with respect to the transistor electrode or with respect to the polysicon section 8' of the plug oxidizes and interrupts the electrical connection.

The adhesion layer 10' and the iridium of the oxygen diffusion barrier 7' need not be patterned with the aid of a lithography plane and etching, but rather can be patterned by means of CMP, for example (CMP, chemical-mechanical polishing). A lithography plane is thus saved. The polysilicon filling of the plug section 8' can possibly be deposited at the same time as the gate polysilicon.

The above-mentioned materials such as iridium, iridium oxide, titanium and silicon oxide are only by way of example. The method according to the invention can also be carried out using different materials and a ferroelectric semiconductor memory according to the invention can also be constructed from different materials.

We claim:

1. An integrated ferroelectric semiconductor memory, comprising:

an intermediate oxide layer above a selection transistor located in or on a semiconductor wafer and a ferroelectric capacitor module formed according to a stack cell principle on said intermediate oxide layer and having a bottom electrode;

an electrically conductive plug formed in a contact hole leading through said intermediate oxide layer and connecting said bottom electrode of said capacitor module to an electrode of the selection transistor;

a conductive oxygen diffusion barrier of Ir and IrOx directly below said bottom electrode for protecting said plug from oxygen diffusion and a conductive adhesion layer below said oxygen diffusion barrier, said adhesion layer and said oxygen diffusion barrier filling said contact hole at least in an upper region thereof and forming said plug in said upper region;

said oxygen diffusion barrier including an Ir layer in said contact hole and an IrOx layer covering said contact hole above said Ir layer.

2. The integrated ferroelectric semiconductor memory according to claim 1, wherein said plug consists of said adhesion layer and said oxygen diffusion barrier.

3. The integrated ferroelectric semiconductor memory according to claim 1, wherein said plug comprises a first segment disposed directly above the selection transistor electrode and formed of a material selected from the group consisting of polysilicon and tungsten, and a second segment above said first segment formed of said adhesion layer and said oxygen diffusion layer.

4. The integrated ferroelectric semiconductor memory according to claim 1, wherein said contact hole has a beveled sidewall tapering downward toward the selection transistor.

5. The integrated ferroelectric semiconductor memory according to claim 1, wherein said adhesion layer comprises Ti.

* * * * *